United States Patent
Enichlmair et al.

(10) Patent No.: US 10,976,200 B2
(45) Date of Patent: Apr. 13, 2021

(54) OPTICAL SENSING DEVICE AND METHOD FOR MANUFACTURING AN OPTICAL SENSING DEVICE

(71) Applicant: ams AG, Premstaetten (AT)

(72) Inventors: Hubert Enichlmair, Premstaetten (AT); Gerhard Eilmsteiner, Premstaetten (AT)

(73) Assignee: AMS AG, Premstaetten (AT)

( * ) Notice: Subject to any disclaimer, the term of this patent is extended or adjusted under 35 U.S.C. 154(b) by 0 days.

(21) Appl. No.: 16/651,194

(22) PCT Filed: Aug. 30, 2018

(86) PCT No.: PCT/EP2018/073374
§ 371 (c)(1),
(2) Date: Mar. 26, 2020

(87) PCT Pub. No.: WO2019/063238
PCT Pub. Date: Apr. 4, 2019

(65) Prior Publication Data
US 2020/0271516 A1  Aug. 27, 2020

(30) Foreign Application Priority Data

Sep. 28, 2017  (EP) .................................... 17193871

(51) Int. Cl.
*G01J 3/02* (2006.01)
*G01J 3/28* (2006.01)

(52) U.S. Cl.
CPC ........... *G01J 3/2803* (2013.01); *G01J 3/0208* (2013.01); *G01J 3/0229* (2013.01)

(58) Field of Classification Search
CPC ........ G01J 3/28; G01J 3/02; G01J 3/36; G01J 3/513; G01J 3/26; G01J 3/12; H01L 27/1446
See application file for complete search history.

(56) References Cited

U.S. PATENT DOCUMENTS

2010/0053755 A1  3/2010  Lee et al.
2012/0092666 A1  4/2012  Meijer
(Continued)

FOREIGN PATENT DOCUMENTS

EP     3182079      6/2017
WO    2013/064510   5/2013

OTHER PUBLICATIONS

European Patent Office, International Search Report for PCT/EP2018/073374 dated Nov. 9, 2018.
(Continued)

*Primary Examiner* — Abdullahi Nur
(74) *Attorney, Agent, or Firm* — MH2 Technology Law Group LLP (57) ABSTRACT

An optical sensing device comprises a photodetector array comprising at least one first photodetector and at least one second photodetector, the photodetector array being arranged on a semiconductor substrate. The optical sensing device further comprises a filter stack arranged on the substrate and covering the photodetector array. The filter stack comprises at least two first lower dielectric mirrors and at least two second lower dielectric mirrors, where a first and a second lower mirror are arranged above the first photodetector and a first and a second lower mirror are arranged above the second photodetector, and where the first lower mirrors have a different thickness in vertical direction which is perpendicular to the main plane of extension of the substrate than the second lower mirrors. The filter stack further comprises a spacer stack arranged on the first and second lower mirrors, and an upper dielectric mirror arranged on the spacer stack and covering the photodetector array. Furthermore, a method for manufacturing an optical sensing device is provided.

20 Claims, 6 Drawing Sheets

(56) References Cited

U.S. PATENT DOCUMENTS

| 2012/0129269 A1 | 5/2012 | Choi et al. |
| 2012/0193741 A1* | 8/2012 | Borthakur ........... H01L 31/0203 |
| | | 257/433 |
| 2012/0200852 A1 | 8/2012 | Tejada |
| 2015/0144770 A1 | 5/2015 | Choi |

OTHER PUBLICATIONS

O'Brien, A. et al.: "Miniature Near-Infrared (NIR) Spectrometer Engine for Handheld Applications" Proc. of SPIE vol. 8374, 837404
Viavi: linear variable filters.
Polster, H. D.: "A symmetrical all dielectric interference filter" 1952, Journal of the Optical Society of America vol. 42, pp. 21-24 (A).
Thelen, A. et al.: "Design of Optical Interference Coatings".
VTT, Open Photonics; (piezo) tunable Fabry-Perot interferometer Background http://www.openphotonics.com/wpcontent/uploads/2013/03/VTTFPI-Overview.pdf.

\* cited by examiner

OPTICAL SENSING DEVICE AND METHOD FOR MANUFACTURING AN OPTICAL SENSING DEVICE

CROSS-REFERENCE TO RELATED APPLICATIONS

The present application is the national stage entry of International Patent Application No. PCT/EP2018/073374, filed on Aug. 30, 2018, which claims the benefit of priority of European Patent Application No. 17193871.5, filed on Sep. 28, 2017, all of which are hereby incorporated by reference in their entirety for all purposes.

BACKGROUND OF THE INVENTION

The present application relates to an optical sensing device and a method for manufacturing an optical sensing device.

Hyperspectral optical sensing devices can be employed to determine the spectral components of light or of a light source. They can further be employed in color sensing spectroscopy or in chemical analysis. Therefore, these sensing devices comprise several filter channels with wavelength-dependent sensitivities. In this way, a spectral range of several hundreds of nanometers can be covered.

However, existing approaches for hyperspectral optical sensing devices can have the drawbacks of cross talk or overlap between filter channels, a reduced accuracy or a small signal-to-noise ratio.

This disclosure provides an optical sensing device with an improved accuracy. It furthermore provides a method for manufacturing an optical sensing device with an improved accuracy.

In one embodiment of the optical sensing device the optical sensing device comprises a photodetector array comprising at least one first photodetector and at least one second photodetector, the photodetector array being arranged on a semiconductor substrate. The first photodetector and the second photodetector are capable of detecting electromagnetic radiation hitting the photodetector array and reaching the photodetectors. The photodetectors can be for example photodiodes. The photodetectors are arranged next to each other in lateral direction which is parallel to the main plane of extension of the semiconductor substrate. Preferably, the optical sensing device comprises a plurality of photodetectors, for example 16 photodetectors. The semiconductor substrate can comprise a semiconductor material as for example silicon.

The optical sensing device further comprises a filter stack arranged on the substrate and covering the photodetector array. The filter stack comprises at least two first lower dielectric mirrors and at least two second lower dielectric mirrors, where a first and a second lower mirror are arranged above the first photodetector and a first and a second lower mirror are arranged above the second photodetector, and where the first lower mirrors have a different thickness in vertical direction which is perpendicular to the main plane of extension of the substrate than the second lower mirrors. The filter stack is arranged on the photodetector array in vertical direction. The filter stack covers the photodetector array in lateral directions.

The lower mirrors comprise at least two dielectric materials. The lower mirrors can for example be Bragg mirrors. One first lower mirror and one second lower mirror are arranged above the first photodetector in vertical direction. The first lower mirror and the second lower mirror above the first photodetector are arranged next to each other in lateral direction. One further first lower mirror and one further second lower mirror are arranged above the second photodetector in vertical direction. The further first lower mirror and the further second lower mirror are arranged next to each other in lateral direction.

The thickness in vertical direction of the first lower mirrors and the second lower mirrors can be for example at least 500 nm and at most 5 µm. Optionally, the thickness in vertical direction of the lower mirrors is approximately 1 µm. Therefore, the lateral extent of the first lower mirrors and of the second lower mirrors can be kept small, for example at least 30 µm and optionally approximately 50 µm.

The first lower mirrors and the second lower mirrors can each comprise several mirror layers comprising at least two dielectric materials. The total thickness in vertical direction of the mirror layers of the first lower mirrors is different from the total thickness in vertical direction of the mirror layers of the second lower mirrors.

The filter stack further comprises a spacer stack arranged on the first and second lower mirrors. The spacer stack is arranged on the first and second lower mirrors in vertical direction and covers the first and second lower mirrors. The spacer stack can comprise a transparent, dielectric material.

The filter stack further comprises an upper dielectric mirror arranged on the spacer stack and covering the photodetector array. The upper dielectric mirror is arranged on the spacer stack in vertical direction. Preferably, the spacer stack and the upper mirror have the same lateral extent. The upper mirror can be a Bragg mirror.

In an optional embodiment of the optical sensing device the upper mirror and the spacer stack form a Fabry-Perot interferometer with each of the lower mirrors. The spacer stack acts as the etalon. This means, one first lower mirror, the spacer stack and the upper mirror form a Fabry-Perot interferometer. Also one second lower mirror, the spacer stack and the upper mirror form a Fabry-Perot interferometer. Each Fabry-Perot interferometer or filter is a filter channel which passes electromagnetic radiation within a specified wavelength range. The specified wavelength range of each filter channel is given by the properties of the upper mirror, the spacer stack and the lower mirror. For example, the specified wavelength range can be influenced by the thicknesses of the materials of each filter channel. As the thickness in vertical direction of the first lower mirrors is different from the thickness in vertical direction of the second lower mirrors, the specified wavelength range of a filter channel comprising a first lower mirror is different from the specified wavelength range of a filter channel comprising a second lower mirror. Therefore, a first filter channel comprising a first lower mirror passes electromagnetic radiation within a wavelength range that is different from a wavelength range of electromagnetic radiation which is passed by a second filter channel comprising a second lower mirror.

In this way, with the first lower mirrors and the second lower mirrors two different filter channels with different spectral sensitivities are formed. As one first lower mirror and one second lower mirror are arranged above the first photodetector, the first photodetector detects both the electromagnetic radiation passed by the first filter channel and the electromagnetic radiation passed by the second filter channel. Thus, the first photodetector can provide a signal which is the sum of the signal detected by the first photodetector from the first filter channel and the signal detected by the first photodetector from the second filter channel.

Similarly, the second photodetector detects both the electromagnetic radiation passed by the first filter channel and the electromagnetic radiation passed by the second filter channel.

Each lower mirror is set to have a specified center wavelength. The specified center wavelength of a lower mirror is the wavelength in the center of the stop-band of the respective mirror. The stop-band of a Bragg mirror is the wavelength region of high reflectivity. For light with a wavelength being equal or approximately equal to the specified center wavelength of a lower mirror the reflectivity of the respective lower mirror is high. Thus, the center wavelengths of the lower mirrors and of the upper mirror influence which light is passed by the respective filter channel. The specified center wavelength of each mirror can be set by the thicknesses of the mirror layers.

Preferably, the specified center wavelength of the first lower mirror and the specified center wavelength of the second lower mirror differ from each other. The specified center wavelength of the first lower mirror and the specified center wavelength of the second lower mirror can for example differ by 10 nm. Therefore, the transmission spectrum of the first filter channel differs from the transmission spectrum of the second filter channel. For example, the wavelengths of maximum transmission of the first filter channel and of the second filter channel can differ by approximately 3 nm. In this way, the transmission spectra of the first filter channel and the second filter channel are superimposed at the photodetectors. The combined transmission spectrum of the first filter channel and the second filter channel is a superposition of the transmission spectrum of the first filter channel and the transmission spectrum of the second filter channel.

The combined transmission spectrum can yield steep slopes and a wider range of transmitted wavelengths than the first or the second transmission spectrum. The shape of the combined transmission spectrum depends on the reflectivity of the upper mirror and the lower mirrors. The reflectivity determines the steepness of the slopes of the transmission spectra. A higher number of mirror layers in a Bragg mirror enhances its reflectivity, but narrows the range of wavelengths that are passed by the respective filter channel. Therefore, the cross talk between different filter channels can be reduced, but additionally the total intensity of the light passed by a filter channel can be reduced. Advantageously, the combined transmission spectrum of the first filter channel and the second filter channel can exhibit both steep slopes and a wider range of transmitted wavelengths than each filter channel separately.

If the filter channels above the second photodetector differ from the filter channels above the first photodetector the combined transmission spectra are different for both photodetectors.

In an optional embodiment the combined transmission spectra of the different filter channels are different for each photodetector of the photodetector array. The wavelengths of maximum transmission of the different combined transmission spectra can for example be equally spaced within a range of wavelengths. Therefore, the optical sensing device can be employed as a wavelength-selective device. The optical sensing device described here enables to reduce the overlap of the combined transmission spectra of neighboring photodetectors. Therefore, the accuracy of the deconvolution of the signals of the photodetectors and thus the accuracy of the optical sensing device is improved.

In one embodiment of the optical sensing device the thickness in vertical direction of the spacer stack above the first photodetector is different from the thickness in vertical direction of the spacer stack above the second photodetector. In order to achieve a difference in thickness of the spacer stack, the spacer stack can comprise several spacer layers which can comprise a third dielectric material. The spacer layers are arranged in such a way on top of each other that the thickness in vertical direction of the spacer stack is different for each photodetector. Consequently, the thickness of the etalon is different for each Fabry-Perot interferometer. By changing the thickness of the etalon of a Fabry-Perot interferometer the wavelength of maximum transmission of the Fabry-Perot interferometer is changed.

The transmission spectra of the first and the second filter channel are superimposed at the first photodetector. In this way, a first spectral channel of the optical sensing device is formed. The first spectral channel comprises a section of the upper mirror, a section of the spacer stack and a first and a second lower mirror above the first photodetector. A second spectral channel comprises a section of the upper mirror, a section of the spacer stack and a first and a second lower mirror above the second photodetector. Preferably, the optical sensing device comprises several spectral channels. For each spectral channel the thickness of the spacer stack in vertical direction is different.

Consequently, the wavelength of maximum transmission of the first spectral channel is different from the wavelength of maximum transmission of the second spectral channel. Preferably, the thicknesses of the spacer layers of the spacer stack are set in such a way that the wavelengths of maximum transmission of the different spectral channels of the photodetector array are distributed over a range of wavelengths. Preferably, the wavelengths of maximum transmission of the different spectral channels of the photodetector array are uniformly distributed over a range of wavelengths.

For example, the optical sensing device can comprise 16 photodetectors and 16 different spectral channels. In this way, the spectral composition of electromagnetic radiation to be detected by the optical sensing device can be analyzed.

It is also possible that the optical sensing device comprises 48 photodetectors and 48 different spectral channels. A large number of spectral channels enables true color sensing spectroscopy of light and chemical analysis of samples.

Advantageously, the transmission spectrum of each spectral channel has steep slopes and a small full width at half maximum. Therefore, the overlap of or the cross talk between the transmission spectra of different spectral channels is small and the accuracy of the measurement of the optical sensing device is improved.

For forming two filter channels for each photodetector the thicknesses of the first and the second lower mirrors are different from one another. The thicknesses of the first and the second lower mirrors are tuned instead of for example tuning the thickness of the spacer stack for each filter channel because a first and a second lower mirror with different thicknesses can be manufactured more stable and more efficient than a corresponding change of the thickness of the spacer stack.

The third dielectric material can be a high refractive index material. Therefore, the spectral channels are less sensitive to tilted angles of light incidence.

In one embodiment of the optical sensing device the lower mirrors comprise first mirror layers comprising a first dielectric material and second mirror layers comprising a second dielectric material with a second refractive index being different from a first refractive index of the first dielectric material, where the first mirror layers and the second mirror layers are arranged alternatingly. For example, the first refractive index can be larger than the second refractive index. It is also possible that the first refractive index is smaller than the second refractive index. The first dielectric material can be for example $TiO_2$, $Ta_2O_5$ or $Nb_2O_5$ and the second dielectric material can be for example silicon oxide. If the specified center wavelength of a lower mirror is in the infrared range the first dielectric material can be amorphous silicon or hydrogenated amorphous silicon.

In one embodiment of the optical sensing device the setup of the first filter channel is as follows:

At first, a dielectric layer comprising the first dielectric material is deposited. On top of the dielectric layer the first lower mirror is deposited. The first lower mirror comprises alternating mirror layers, where the first mirror layer comprises the first dielectric material and the second mirror layer comprises the second dielectric material. The first mirror layer is deposited on top of the dielectric layer and the second mirror layer is deposited on top of the first mirror layer. The first lower mirror can for example comprise at least three and at most six pairs of alternating mirror layers. The spacer stack is arranged on the first lower mirror and comprises the third dielectric material with a high refractive index. The upper mirror is deposited on the spacer stack. Similar to the first lower mirror the upper mirror comprises pairs of alternating mirror layers. A second mirror layer comprising the second dielectric material is deposited on the spacer stack. A first mirror layer comprising the first dielectric material is deposited on the second mirror layer. On top of the upper mirror a further dielectric layer comprising the first dielectric material is deposited.

The only difference to the second filter channel is that the second filter channel comprises the second lower mirror instead of the first lower mirror.

By depositing the dielectric layer and the further dielectric layer the signal to noise ratio of the respective filter channel is improved.

In one embodiment of the optical sensing device at least some of the first mirror layers and at least some of the second mirror layers of the lower mirrors have a thickness corresponding to an optical thickness being equal to one quarter of a specified center wavelength. Preferably, at least some of the first mirror layers and at least some of the second mirror layers of the upper dielectric mirror have a thickness corresponding to an optical thickness being equal to one quarter of a specified center wavelength of the upper mirror.

The thicknesses of the mirror layers of the lower mirrors and of the mirror layers of the upper mirror are different and consequently the specified center wavelength is different for the lower mirrors and for the upper mirror. Preferably, the specified center wavelength of the upper mirror is larger than the specified center wavelength of the first lower mirror and smaller than the specified center wavelength of the second lower mirror.

In one embodiment of the optical sensing device the first lower mirror has a first stop-band and the second lower mirror has a second stop-band. The first stop-band can be different from the second stop-band. That the stop-bands of the first lower mirror and the second lower mirror are different from each other means that the specified center wavelength is different for the first and the second lower mirror. Because of the different stop-bands the transmission spectra of the first filter channel and of the second filter channel are different.

In one embodiment of the optical sensing device a first center wavelength of the first stop-band is given by the thickness of the mirror layers of the first lower mirror and a second center wavelength of the second stop-band is given by the thickness of the mirror layers of the second lower mirror. The first center wavelength of the first stop-band is the wavelength in the center of the first stop-band. The second center wavelength of the second stop-band is the wavelength in the center of the second stop-band. Therefore, the stop-bands of the lower mirrors influence the transmission spectrum of the respective filter channel.

In one embodiment of the optical sensing device the first center wavelength and the second center wavelength are different from one another. Therefore, the transmission spectra of the first filter channel and of the second filter channel are different from one another.

In one embodiment of the optical sensing device the first center wavelength differs from the second center wavelength by at least 1 nm and at most 30 nm. For these small differences between the center wavelengths the superposition of the transmission spectra of the first filter channel and of the second filter channel is a combined transmission spectrum with steep slopes and a small full width at half maximum. Therefore, the spectral sensitivity of the optical sensing device and thus the accuracy of the measurement of the optical sensing device are improved.

In one embodiment of the optical sensing device the first photodetector and the second photodetector comprise two sub-photodetectors, respectively, where the sub-photodetectors are arranged next to each other in lateral direction which is parallel to the main plane of extension of the substrate. For each photodetector one sub-photodetector is arranged to detect electromagnetic radiation passed by the first filter channel and a further sub-photodetector is arranged to detect the electromagnetic radiation passed by the second filter channel. Instead of combining the signals of the two filter channels with one photodetector, the signals of the sub-photodetectors are added. In this way, the combined transmission of the first and the second filter channel can be determined.

In one embodiment of the optical sensing device a decoupling layer covering the photodetector array is arranged on the upper mirror. Preferably, the decoupling layer has the same lateral extent as the upper mirror. The decoupling layer is arranged on the upper mirror such that a bandpass filter can be arranged on the decoupling layer. In that case the decoupling layer decouples the bandpass filter optically from the Fabry-Perot filter. The decoupling layer can comprise a dielectric material.

In one embodiment of the optical sensing device a bandpass filter covering the photodetector array is arranged on the upper mirror. Preferably, the bandpass filter is arranged on the decoupling layer and has the same lateral extent as the decoupling layer. It is also possible that the bandpass filter is directly arranged on the upper mirror. The bandpass filter has a pass-band within which electromagnetic radiation is passed. Moreover, the bandpass filter has a stop-band within which electromagnetic radiation is blocked or attenuated.

The bandpass filter can be employed to prevent unwanted light from reaching the photodetector array. For example, if the filter channels of the filter stack do not block light in some wavelength regions, an additional bandpass filter can be employed. The pass-band of the bandpass filter extends over the region of wavelengths that are passed by the filter channels. The transmission of the bandpass filter in the region of wavelengths that are passed by the filter channels can be close to 100%. Furthermore, the transmission of the bandpass filter within the stop-band of the upper mirror and the lower mirrors can be close to 100%. Electromagnetic radiation outside of the pass-band of the bandpass filter is suppressed by the bandpass filter. The bandpass filter can be a dielectric bandpass filter.

The decoupling layer is arranged between the upper mirror and the bandpass filter in order to decouple the filter channels from the bandpass filter. The thickness of the decoupling layer is set according to the following relation:

$$d = \frac{(\phi_{up} + \phi_{BP})}{2},$$

where d is the optical thickness of the decoupling layer, and $\phi_{up}$ and $\phi_{BP}$ are the phase changes of passing light due to the reflection on the upper mirror and on the bandpass filter, respectively. Consequently, the total transmission through the bandpass filter and the filter channels is the product of the transmission of the bandpass filter and the transmission of the respective filter channel.

The upper mirror, the decoupling layer and the bandpass filter can have the same lateral extent. Therefore, the upper mirror, the decoupling layer and the bandpass filter can be patterned with only one mask.

It is also possible that the optical sensing device comprises several photodetector arrays with different spectral sensitivities and different bandpass filters in order to detect a large range of wavelengths.

In one embodiment of the optical sensing device the spacer stack comprises a first spacer layer comprising a third dielectric material and a second spacer layer comprising the third dielectric material, where a first segment of the second spacer layer is arranged on the first spacer layer and covers the second photodetector but not the first photodetector. Therefore, the thickness in vertical direction of the spacer stack above the first photodetector is different from the thickness in vertical direction of the spacer stack above the second photodetector. By employing the first spacer layer and the second spacer layer the different thicknesses of the spacer stack can be manufactured efficiently.

In one embodiment of the optical sensing device the photodetector array comprises four photodetectors and the first spacer layer covers all four photodetectors. The second spacer layer only covers the third and the fourth photodetector. A first segment of a third spacer layer covers the second photodetector and a second segment of the third spacer layer covers the fourth photodetector. In this way, the thickness of the spacer stack is different for each photodetector. For manufacturing the spacer stack $2^N$ different thicknesses of the spacer stack are formed by N masking steps. Therefore, the spacer stack can be formed more efficiently than by depositing the required thickness of the spacer stack for each photodetector separately.

In one embodiment of the optical sensing device a first spectral channel is formed by one first lower mirror, one second lower mirror, a section of the spacer stack covering the first photodetector and a section of the upper mirror covering the first photodetector, and a second spectral channel is formed by one first lower mirror, one second lower mirror, a section of the spacer stack covering the second photodetector and a section of the upper mirror covering the second photodetector. The transmission spectrum of the first spectral channel is different from the transmission spectrum of the second spectral channel. Therefore, the photodetector array can detect different spectral components of electromagnetic radiation to be analyzed.

In one embodiment of the optical sensing device the first and the second photodetector are configured to detect light incident on the optical sensing device and passing through the upper mirror, the spacer stack and the two lower mirrors. The light to be detected by the optical sensing device can for example be in the visible or mid infrared range.

Furthermore, a method for manufacturing an optical sensing device is provided. The optical sensing device can optionally be produced by means of one of the methods described herein. This means all features disclosed for the optical sensing device are also disclosed for the method for manufacturing an optical sensing device and vice-versa.

According to at least one embodiment of the method for manufacturing an optical sensing device, the method comprises the step of providing a photodetector array arranged on a semiconductor substrate, where the photodetector array comprises at least one first photodetector and at least one second photodetector. The first photodetector and the second photodetector are arranged next to each other in a lateral direction which is parallel to the main plane of extension of the semiconductor substrate. Preferably, the photodetector array comprises a plurality of photodetectors. The photodetectors are capable of detecting electromagnetic radiation and they can be for example photodiodes.

The method for manufacturing an optical sensing device further comprises the step of depositing a first lower dielectric mirror above each photodetector in a vertical direction which is perpendicular to the main plane of extension of the substrate by employing a first mask. The first lower mirror can comprise several mirror layers. The mirror layers are deposited through the first mask. The first mask is structured in such a way that above each photodetector one first lower mirror is deposited. The mirror layers can be deposited or sputtered.

The method for manufacturing an optical sensing device further comprises the step of depositing a second lower dielectric mirror above each photodetector in vertical direction by employing a second mask, where the first lower mirror and the second lower mirror of each photodetector are arranged next to each other in a lateral direction which is parallel to the main plane of extension of the substrate and where the first lower mirrors have a different thickness in vertical direction than the second lower mirrors. The second lower mirror can comprise several mirror layers. The mirror layers are deposited through the second mask. The second mask is structured in such a way that above each photodetector one second lower mirror is deposited. The mirror layers can be deposited or sputtered.

The method for manufacturing an optical sensing device further comprises the steps of depositing a spacer stack arranged on the first and second lower mirrors, and depositing an upper dielectric mirror arranged on the spacer stack and covering the photodetector array.

For the optical sensing device manufactured by the method described here the overlap of or the cross talk between the transmission spectra of different spectral channels is small and the accuracy of the measurement of the optical sensing device is improved.

According to at least one embodiment of the method for manufacturing an optical sensing device the thickness in vertical direction of the spacer stack above the first photodetector is different from the thickness in vertical direction of the spacer stack above the second photodetector. Therefore, the first spectral channel is formed above the first photodetector and the second spectral channel is formed above the second photodetector. The transmission spectrum of the first spectral channel is different from the transmission spectrum of the second spectral channel. Therefore, the photodetector array can detect different spectral components of electromagnetic radiation to be analyzed.

According to at least one embodiment of the method for manufacturing an optical sensing device, depositing the spacer stack comprises depositing a first spacer layer on the first and second lower mirrors, where the first spacer layer comprises a third dielectric material, depositing a second spacer layer on the first spacer layer, where the second spacer layer comprises the third dielectric material, and structuring the second spacer layer by employing a third mask such that a first segment of the second spacer layer covers the second photodetector but not the first photodetector. This method can be employed to form a spacer stack for a photodetector array with a plurality of photodetectors. By employing N masks $2^N$ different thicknesses of the spacer stack for $2^N$ photodetectors can be formed. As only N masks are required to form $2^N$ different thicknesses the optical sensing device can be manufactured efficiently.

BRIEF DESCRIPTION OF THE DRAWINGS

The following description of figures may further illustrate and explain exemplary embodiments. Components that are functionally identical or have an identical effect are denoted by identical references. Identical or effectively identical components might be described only with respect to the figures where they occur first. Their description is not necessarily repeated in successive figures.

DETAILED DESCRIPTION

Figure 1:
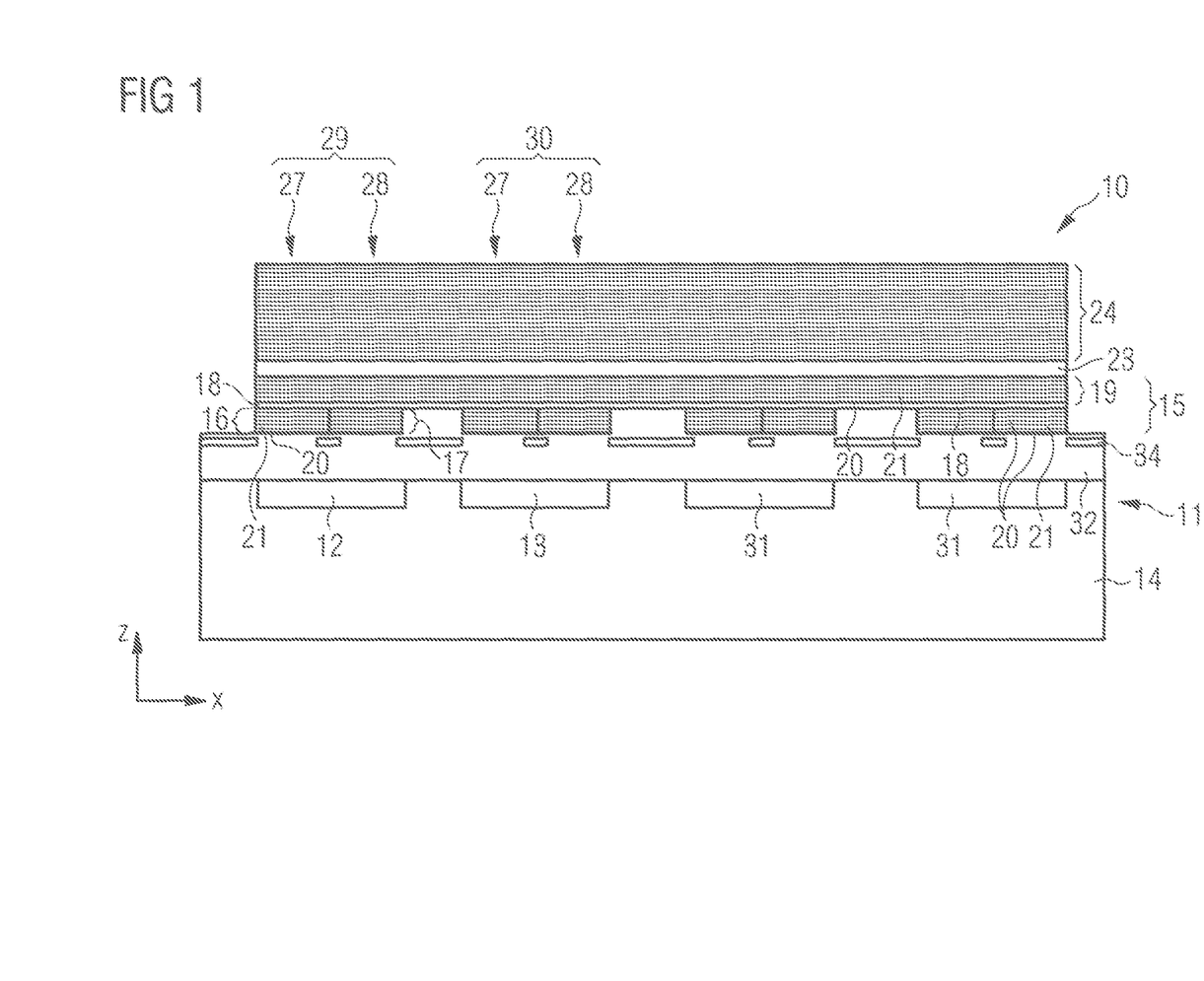
In FIG. 1 a cutaway view of an exemplary embodiment of an optical sensing device is shown.

FIG. 1 shows an exemplary embodiment of an optical sensing device 10. The optical sensing device 10 can be manufactured by a method described herein. A photodetector array 11 is arranged on a semiconductor substrate 14. The photodetector array 11 comprises a first photodetector 12, a second photodetector 13 and two further photodetectors 31. The substrate 14 can comprise silicon. The photodetectors 12, 13, 31 are manufactured on and within the substrate 14 and they can be photodiodes. The substrate 14 can comprise an integrated circuit in order to electrically contact the photodetectors 12, 13, 31. The photodetectors 12, 13, 31 of the photodetector array 11 are arranged next to each other in lateral direction x which is parallel to the main plane of extension of the substrate 14.

On top of the photodetectors 12, 13, 31 and the substrate 14 a transparent layer 32 is arranged. The transparent layer 32 is optically transparent and comprises silicon dioxide. The transparent layer 32 is employed to electrically isolate metal layers of the integrated circuit. The transparent layer 32 can be planarized in order to allow a precise growth of a following filter stack 15.

A light absorbing layer 34 which can comprise a metal is arranged on the transparent layer 32. The light absorbing layer 34 comprises openings above the photodetectors 12, 13, 31. The light absorbing layer 34 is arranged to block light or electromagnetic radiation that hits the transparent layer 32 from a side that faces away from the substrate 14.

On top of the light absorbing layer 34 a filter stack 15 is arranged. The filter stack 15 comprises first lower mirrors 16 and second lower mirrors 17. One first lower mirror 16 and one second lower mirror 17 are arranged above each photodetector 12, 13, 31. The first lower mirror 16 and the second lower mirror 17 above one photodetector 12, 13, 31 are arranged next to each other in lateral direction x. The lower mirrors 16, 17 can be Bragg mirrors.

The lower mirrors 16, 17 comprise pairs of alternating first mirror layers 20 and second mirror layers 21. The first mirror layers 20 comprise a first dielectric material with a first refractive index and the second mirror layers 21 comprise a second dielectric material with a second refractive index. Preferably, the first refractive index is larger than the second refractive index.

The thicknesses in vertical direction z of the mirror layers 20, 21 of the first lower mirror 16 are different from the thicknesses in vertical direction z of the mirror layers 20, 21 of the second lower mirror 17, where the vertical direction z is perpendicular to the main plane of extension of the substrate 14. Preferably, the mirror layers 20, 21 of the first lower mirror 16 have a thickness corresponding to an optical thickness being equal to one quarter of a first specified center wavelength, respectively. Preferably, the mirror layers 20, 21 of the second lower mirror 17 have a thickness corresponding to an optical thickness being equal to one quarter of a second specified center wavelength, respectively. The specified center wavelength of the respective lower mirror 16, 17 is the center of the stop-band of the respective lower mirror 16, 17. The stop-band of a Bragg mirror is the wavelength region of high reflectivity.

As the thicknesses in vertical direction z of the mirror layers 20, 21 of the first lower mirror 16 are different from the thicknesses in vertical direction z of the mirror layers 20, 21 of second lower mirror 17, the first center wavelength is different from the second center wavelength.

The first lower mirror 16 and the second lower mirror 17 are arranged directly adjacent to each other. At the border between the first lower mirror 16 and the second lower mirror 17 the mirror layers 20, 21 can be less well-defined. Therefore, the openings in the light absorbing layer 34 are arranged in such a way, that the light absorbing layer 34 is arranged between the border between the first lower mirror 16 and the second lower mirror 17 and the photodetector 12, 13, 31. This means, the light absorbing layer 34 comprises two openings above each photodetector 12, 13, 31 such that one opening is arranged below the first lower mirror 16 and another opening is arranged below the second lower mirror 17. Thus, light passing the region of the border between the two lower mirrors 16, 17 is prevented from reaching the photodetector 12, 13, 31 by the light absorbing layer 34.

The filter stack 15 further comprises a spacer stack 18 which is arranged on the lower mirrors 16, 17. The spacer stack 18 covers the photodetector array 11 completely. The spacer stack 18 comprises a third dielectric material and it can comprise several spacer layers 25, 26. The thickness of the spacer stack 18 in vertical direction z above the first photodetector 12 is different from the thickness in vertical direction z of the spacer stack 18 above the second photodetector 13.

The filter stack 15 further comprises an upper dielectric mirror 19 that is arranged on the spacer stack 18. The upper mirror 19 has the same lateral extent as the spacer stack 18 and the upper mirror 19 can be a Bragg mirror. Similar to the lower mirrors 16, 17 the upper mirror 19 comprises first mirror layers 20 and second mirror layers 21 that are arranged alternatingly. The first mirror layers 20 comprise a first dielectric material with a first refractive index and the second mirror layers 21 comprise a second dielectric material with a second refractive index. For the upper mirror 19 the second mirror layer 21 is deposited on the spacer stack 18 and the first mirror layer 20 is deposited on the second mirror layer 21.

The thicknesses of the mirror layers 20, 21 of the lower mirrors 16, 17 and of the mirror layers 20, 21 of the upper mirror 19 are different from each other and consequently the specified center wavelength is different for the lower mirrors 16, 17 and the upper mirror 19. Preferably, the specified center wavelength of the upper mirror 19 is larger than the specified center wavelength of the first lower mirror 16 and smaller than the specified center wavelength of the second lower mirror 17.

One first lower mirror 16, a section of the spacer stack 18 and a section of the upper mirror 19 above one first photodetector 12 form a Fabry-Perot interferometer. The spacer stack 18 acts as the etalon. The Fabry-Perot interferometer formed by one first lower mirror 16, a section of the spacer stack 18 and a section of the upper mirror 19 above one first photodetector 12 is referred to as a first filter channel 27. A second filter channel 28 is formed by one second lower mirror 17, a section of the spacer stack 18 and a section of the upper mirror 19 above one first photodetector 12. Each filter channel 27, 28 passes electromagnetic radiation within a specified wavelength range.

As the thickness in vertical direction z of the first lower mirror 16 is different from the thickness in vertical direction z of the second lower mirror 17, the specified wavelength range of the first filter channel 27 is different from the specified wavelength range of the second filter channel 28. Therefore, the first filter channel 27 passes electromagnetic radiation within a wavelength range that is different from a wavelength range of electromagnetic radiation which is passed by the second filter channel 28.

As one first lower mirror 16 and one second lower mirror 17 are arranged above the first photodetector 12, the first photodetector 12 detects both the electromagnetic radiation passed by the first filter channel 27 and the electromagnetic radiation passed by the second filter channel 28. Thus, the first photodetector 12 can provide a signal which is the sum of the signals detected by the first photodetector 12 from the first filter channel 27 and the signal detected by the first photodetector 12 from the second filter channel 28.

Similarly, the other photodetectors 13, 31 detect both the electromagnetic radiation passed by a first filter channel 27 and the electromagnetic radiation passed by a second filter channel 28.

By adding the signals of the first filter channel 27 and of the second filter channel 28 at the first photodetector 12 a first spectral channel 29 is formed. The first spectral channel 29 comprises a section of the upper mirror 19, a section of the spacer stack 18 and a first and a second lower mirror 16, 17 above the first photodetector 12. Further spectral channels 30 are formed above the further photodetectors 13, 31 in a similar way.

The wavelength of maximum transmission of the first spectral channel 29 is different from the wavelength of maximum transmission of a second spectral channel 30. Preferably, the thicknesses of the spacer layers 25, 26 of the spacer stack 18 are set in such a way that the wavelengths of maximum transmission of the different spectral channels 29, 30 of the photodetector array 11 are distributed over a large range of wavelengths.

On top of the upper mirror 19 a decoupling layer 23 is arranged. The decoupling layer 23 has the same lateral extent as the top mirror 19. The decoupling layer 23 can comprise a dielectric material.

A bandpass filter 24 is arranged on top of the decoupling layer 23. The bandpass filter 24 has the same lateral extent as the decoupling layer 23. The bandpass filter 24 can be employed to prevent unwanted light from reaching the photodetector array 11. For example, if the filter channels 27, 28 do not block light in some wavelength regions, an additional bandpass filter 24 can be employed. The passband of the bandpass filter 24 extends over the region of wavelengths that are passed by the filter channels 27, 28. Electromagnetic radiation outside of this pass-band is suppressed by the bandpass filter 24. The decoupling layer 23 is arranged between the upper mirror 19 and the bandpass filter 24 in order to decouple the filter channels 27, 28 from the bandpass filter 24.

For manufacturing the optical sensing device 10 the lateral extent of the upper mirror 19, the decoupling layer 23 and the bandpass filter 24 can advantageously be patterned with only one mask.

Preferably, the optical sensing device 10 comprises 16 or more photodetectors 12, 13, 31 and 16 or more different spectral channels 29, 30. In this way, the spectral composition of electromagnetic radiation to be detected by the optical sensing device 10 can be analyzed.

Figure 2:
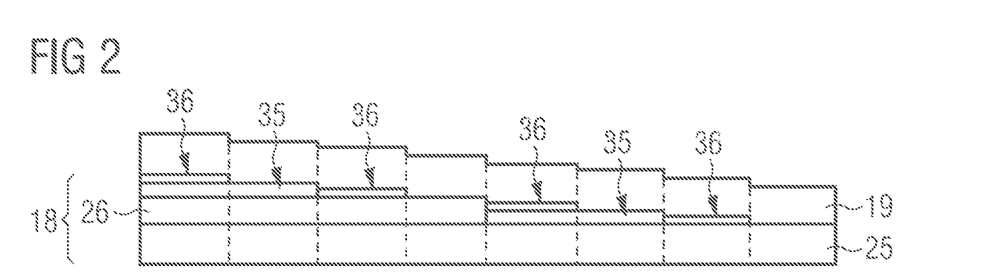
In FIG. 2 a cutaway view of an exemplary embodiment of a spacer stack is shown.

In FIG. 2 a cutaway view of an exemplary embodiment of a spacer stack 18 is shown. The spacer stack 18 has different thicknesses such that eight sections of the spacer stack 18 with different thicknesses in vertical direction z are formed. Therefore, with the spacer stack 18 eight spectral channels 29, 30 of the optical sensing device 10 can be formed.

A first spacer layer 25 covers all eight photodetectors 12, 13, 31 that are arranged below the spacer stack 18 and that are not shown in FIG. 2. A second spacer layer 26 covers four of the photodetectors 12, 13, 31. A third spacer layer 35 covers two photodetectors 31 that are not covered by the second spacer layer 26 and two photodetectors 31 that are covered by the second spacer layer 26. A fourth spacer layer 36 covers every second photodetector 13, 31. In this way, the thickness of the spacer stack 18 is different for each photodetector 12, 13, 31. For manufacturing the spacer stack 18 $2^N$ different thicknesses of the spacer stack 18 are formed by N masking steps. Therefore, the spacer stack 18 can be formed more efficiently than by depositing the required thickness of the spacer stack 18 for each photodetector 12, 13, 31 separately.

The upper mirror 19 completely covers the spacer stack 18.

Figure 3:
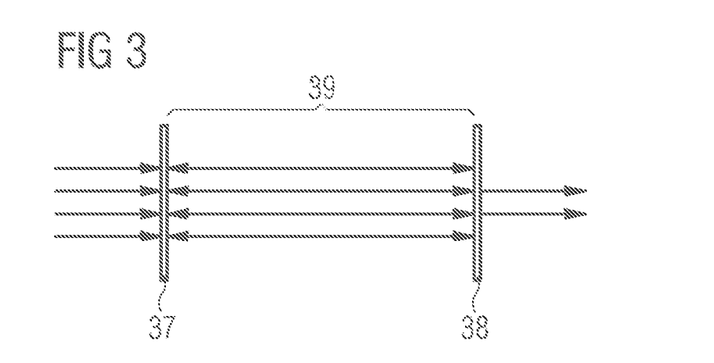
FIG. 3 shows a schematic setup of a Fabry-Perot interferometer.

FIG. 3 shows a schematic setup of a Fabry-Perot interferometer. Incoming light reaches a first mirror 37 and enters an etalon 39 which comprises a transparent, dielectric material. The light traveling through the etalon 39 is reflected at a second mirror 38 and at the first mirror 37. The first mirror 37 and the second mirror 38 can be Bragg mirrors. The transmittance of the Fabry-Perot interferometer is high for light with a wavelength λ if the optical thickness of the etalon 39 is equal to multiples of half the wavelength λ. For other wavelengths the transmittance of the Fabry-Perot interferometer is lower.

Figure 4:
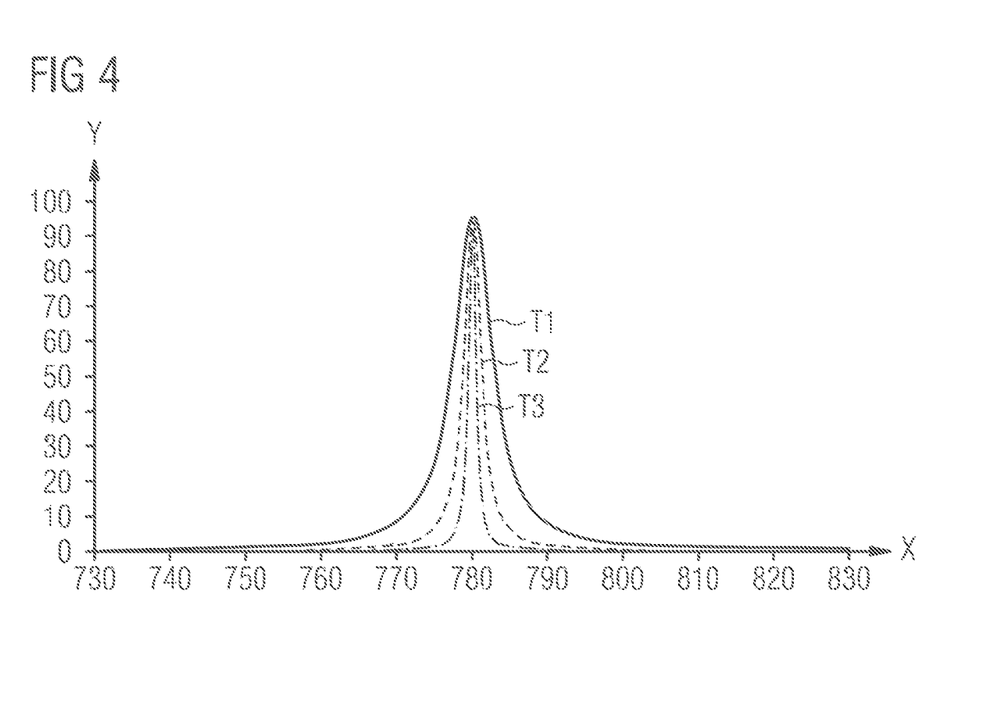
FIG. 4 shows exemplary transmission spectra of a Fabry-Perot interferometer.

FIG. 4 shows exemplary transmission spectra of a Fabry-Perot interferometer. The two mirrors 37, 38 of the Fabry-Perot interferometer comprise pairs of alternating first and second mirror layers 20, 21. On the x-axis the wavelength is plotted in nanometers and on the y-axis the transmission is plotted in percent. The axes are the same for all following figures. For the first transmission spectrum T1 the mirrors 37, 38 comprise five pairs of alternating first and second mirror layers 20, 21. For the second transmission spectrum T2 the mirrors 37, 38 comprise six pairs of alternating first and second mirror layers 20, 21 and for the third transmission spectrum T3 the mirrors 37, 38 comprise seven pairs of alternating first and second mirror layers 20, 21. With an increasing number of pairs of alternating first and second mirror layers 20, 21 the full width at half maximum of the transmission spectrum decreases and the slope of the transmission spectrum becomes steeper.

Figure 5:
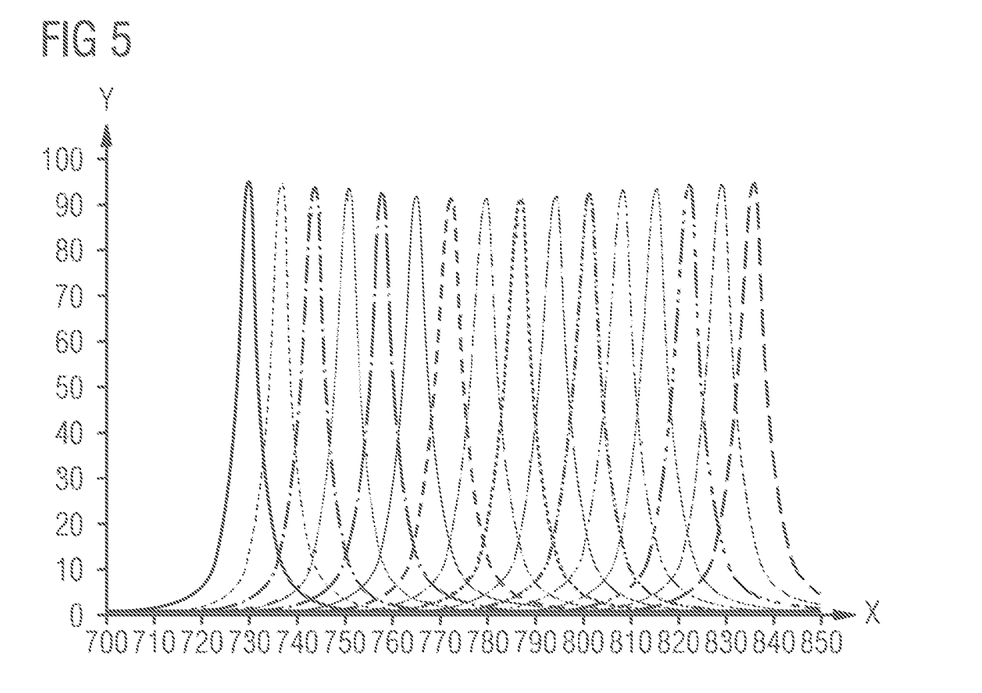
In FIG. 5 the transmission spectra of 16 different Fabry-Perot interferometers are shown.

In FIG. 5 the transmission spectra of 16 different Fabry-Perot interferometers are shown. The wavelengths of maximum transmission for the 16 Fabry-Perot interferometers are equally spaced and lie between 720 nm and 850 nm. The wavelength of maximum transmission of the different Fabry-Perot interferometers is tuned by the thickness of the etalon 39.

Figure 6:
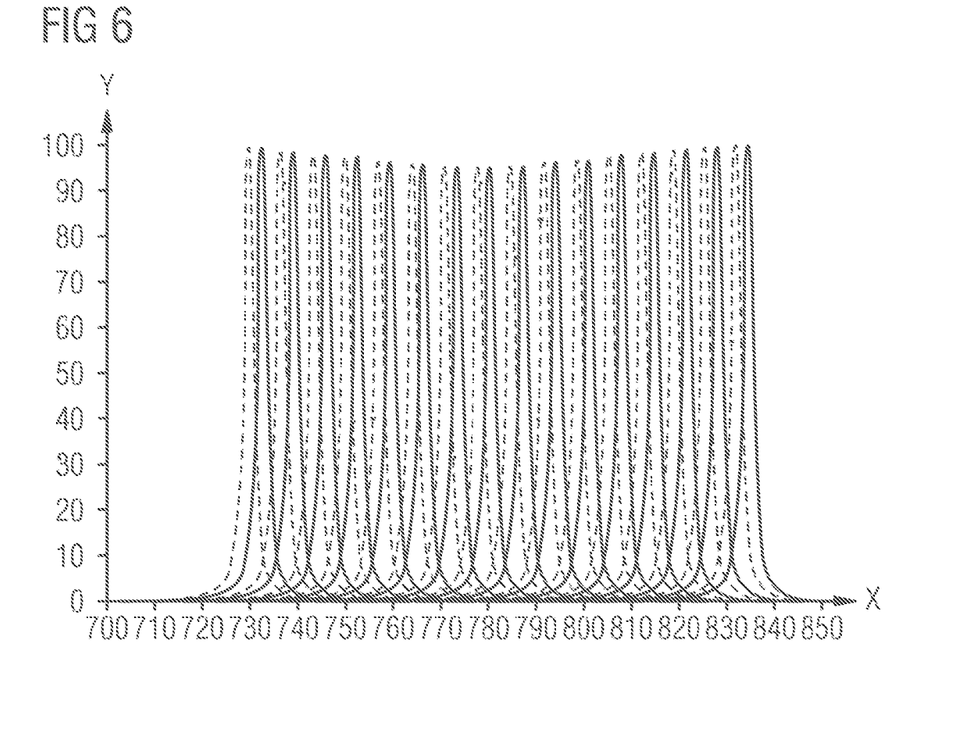
In FIG. 6 the transmission spectra of 32 filter channels of an exemplary embodiment of the optical sensing device are shown.

In FIG. 6 the transmission spectra of 32 filter channels 27, 28 of an exemplary embodiment of the optical sensing device 10 are shown. For 16 spectral channels 29, 30 the transmission spectra of the first and the second filter channel 27, 28 are shown. The transmission spectra of the first filter channels 27 are marked with dashed lines and the transmission spectra of the second filter channels 28 are marked with solid lines. For each spectral channel 29, 30 the transmission spectra of the first and the second filter channels 27, 28 overlap.

For each first lower mirror 16 of the optical sensing device 10 the center wavelength of the stop-band amounts to 773 nm and for each second lower mirror 17 the center wavelength of the stop-band amounts to 783 nm. The center wavelength of the stop-band of the upper mirror 19 is 778 nm. The wavelength of maximum transmission is different for each spectral channel 29, 30 as the thickness of the spacer stack 18 is different for each spectral channel 29, 30.

The full width at half maximum of the transmission spectra of the filter channels 27, 28 is smaller than for the Fabry-Perot interferometers shown in FIG. 5 and amounts to less than 7 nm.

Figure 7:
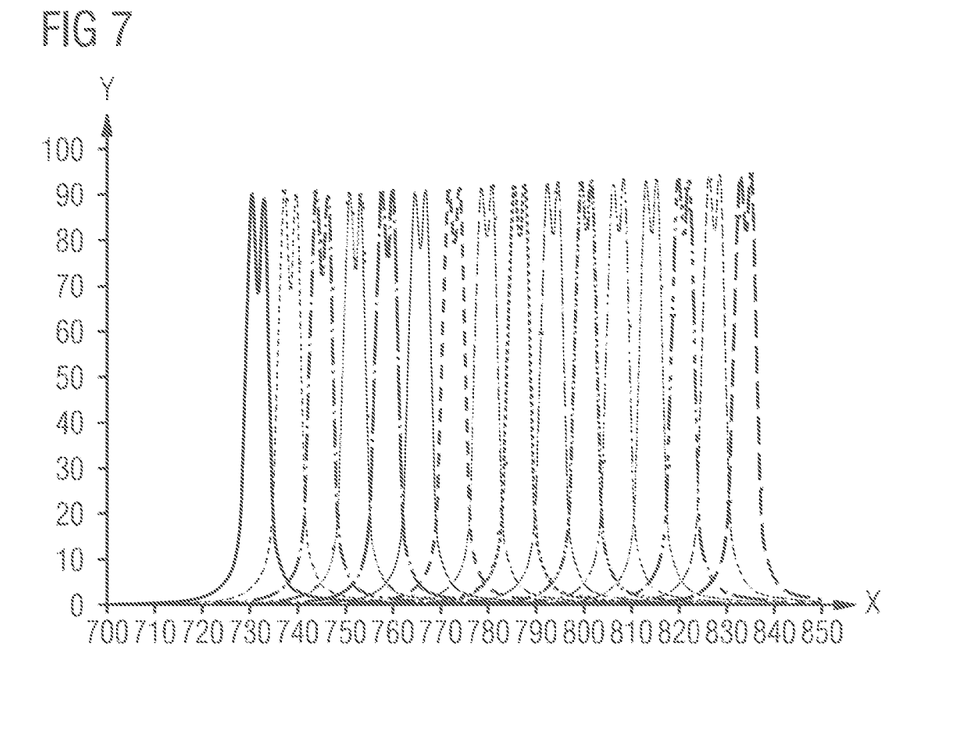
In FIG. 7 exemplary transmission spectra of 16 spectral channels are shown.

In FIG. 7 exemplary transmission spectra of 16 spectral channels of an exemplary embodiment the optical sensing device 10 are shown. Each transmission spectrum is the sum of the transmission spectrum of one first filter channel 27 and the transmission spectrum of one second filter channel 28. The transmission spectra are uniformly distributed over the range of wavelengths.

Figure 8:
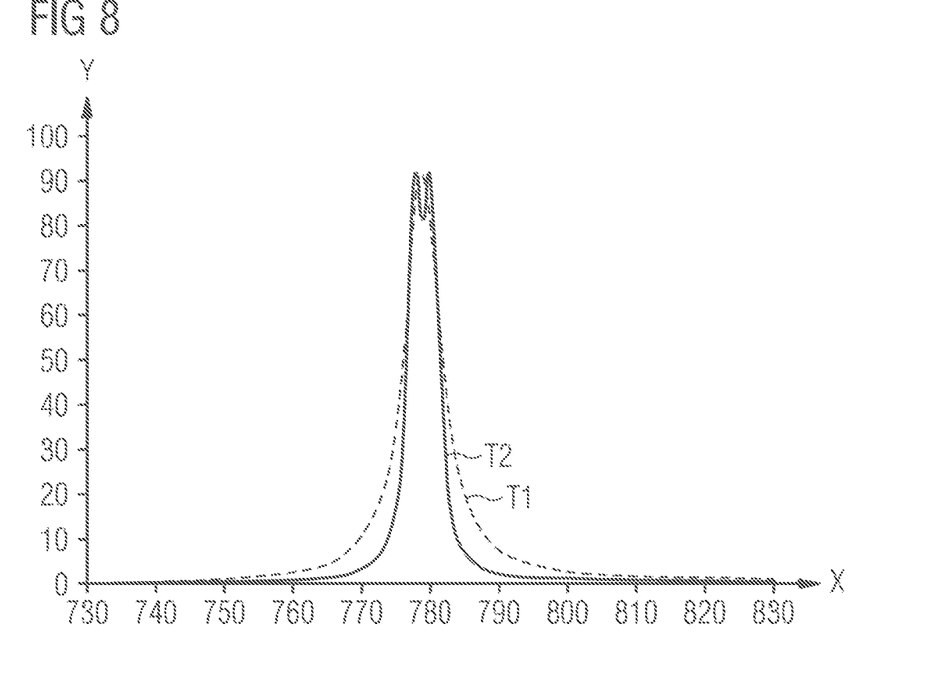
In FIG. 8 exemplary transmission spectra of two spectral channels are shown.

In FIG. 8 exemplary transmission spectra T1, T2 of two spectral channels are shown. The first transmission spectrum T1 shows the transmission of a Fabry-Perot interferometer as shown for example in FIG. 5. The second transmission spectrum T2 shows the transmission of one spectral channel 29 of one embodiment of the optical sensing device 10 described herein. The second transmission spectrum T2 corresponds to one of the transmission spectra shown in FIG. 7. The full width at half maximum of the second transmission spectrum T2 is smaller than for the first transmission spectrum T1. Furthermore, the slopes of the second transmission spectrum T2 are steeper. Therefore, the overlap between different spectral channels 29, 30 is decreased for the optical sensing device 10 described here.

Figure 9:
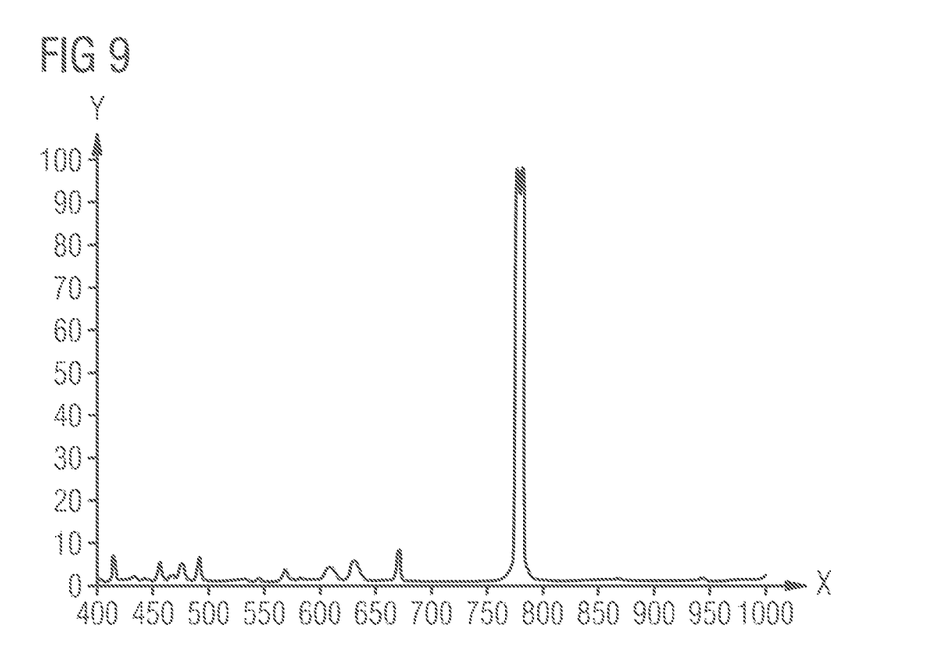
FIG. 9 shows the transmission spectrum of one spectral channel of an exemplary embodiment of the optical sensing device.

FIG. 9 shows the transmission spectrum of one spectral channel 29 of an exemplary embodiment of the optical sensing device 10. The optical sensing device 10 further comprises the bandpass filter 24. Outside of the transmission peak of the filter stack 15 the transmission of light is suppressed in a large range of wavelengths.

Figure 10:
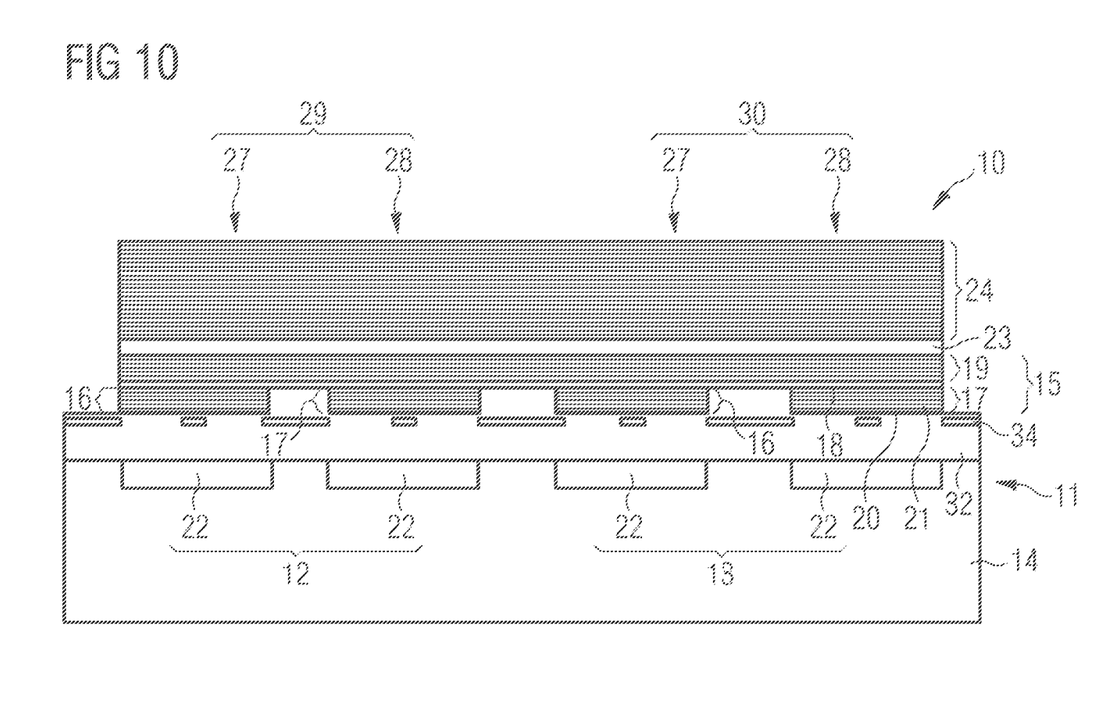
In FIG. 10 a cutaway view of a further exemplary embodiment of the optical sensing device is shown.

In FIG. 10 a cutaway view of a further exemplary embodiment of the optical sensing device 10 is shown. The setup shown in FIG. 10 is the same as in FIG. 1 except for the arrangement of the photodetectors 12, 13 and the lower mirrors 16, 17. Each photodetector 12, 13 comprises two sub-photodetectors 22. The sub-photodetectors 22 are arranged next to each other in lateral direction x. Above each sub-photodetector 22 one lower mirror 16, 17 is arranged. The lower mirrors 16, 17 are not arranged directly adjacent to each other but are separated from each other. The openings of the light absorbing layer 34 are arranged below the lower mirrors 16, 17.

For each photodetector 12, 13 one sub-photodetector 22 is arranged to detect electromagnetic radiation passed by the first filter channel 27 and a further sub-photodetector 22 is arranged to detect the electromagnetic radiation passed by the second filter channel 28. Instead of combining the signals of the two filter channels 27, 28 with one photodetector 12, 13, 31 the signals of the sub-photodetectors 22 are added. In this way, the combined transmission of the first and the second filter channel 27, 28 can be determined.

The invention claimed is:

1. An optical sensing device comprising:
   a photodetector array comprising at least one first photodetector and at least one second photodetector, the photodetector array being arranged on a semiconductor substrate,
   a filter stack arranged on the substrate and covering the photodetector array, the filter stack comprising:
   at least two first lower dielectric mirrors and at least two second lower dielectric mirrors, where a first and a second lower mirror are arranged above the first photodetector and a first and a second lower mirror are arranged above the second photodetector, and where the first lower mirrors have a different thickness in vertical direction which is perpendicular to the main plane of extension of the substrate than the second lower mirrors,
   a spacer stack arranged on the first and second lower mirrors, and
   an upper dielectric mirror arranged on the spacer stack and covering the photodetector array.

2. The optical sensing device according to claim 1, wherein the first lower mirror and the second lower mirror of each photodetector are arranged next to each other in a lateral direction which is parallel to the main plane of extension of the substrate.

3. The optical sensing device according to claim 1, wherein the thickness in vertical direction of the spacer stack above the first photodetector is different from the thickness in vertical direction of the spacer stack above the second photodetector.

4. A sensing device according to claim 1, wherein the lower mirrors comprise first mirror layers comprising a first dielectric material and second mirror layers comprising a second dielectric material with a second refractive index being different from a first refractive index of the first dielectric material, where the first mirror layers and the second mirror layers are arranged alternatingly.

5. The optical sensing device according to claim 4, wherein at least some of the first mirror layers and at least some of the second mirror layers of the lower mirrors have a thickness corresponding to an optical thickness being equal to one quarter of a specified center wavelength.

6. The optical sensing device according to claim 1, wherein the first lower mirror has a first stop-band and the second lower mirror has a second stop-band.

7. The optical sensing device according to claim 6, wherein a first center wavelength of the first stop-band is given by the thickness of the mirror layers of the first lower mirror and a second center wavelength of the second stop-band is given by the thickness of the mirror layers of the second lower mirror.

8. The optical sensing device according to claim 7, wherein the first center wavelength and the second center wavelength are different from one another.

9. The optical sensing device according to claim 7, wherein the first center wavelength differs from the second center wavelength by at least 1 nm and at most 20 nm.

10. The optical sensing device according to claim 1, wherein the first photodetector and the second photodetector comprise two sub-photodetectors, respectively, where the sub-photodetectors are arranged next to each other in lateral direction which is parallel to the main plane of extension of the substrate.

11. The optical sensing device according to claim 10, wherein signals of the two sub-photodetectors of each photodetector are combined, in particular added.

12. The optical sensing device according to claim 1, wherein a decoupling layer covering the photodetector array is arranged on the upper mirror.

13. The optical sensing device according to claim 1, wherein a bandpass filter covering the photodetector array is arranged on the upper mirror.

14. The optical sensing device according to claim 1, wherein the spacer stack comprises a first spacer layer comprising a third dielectric material and a second spacer layer comprising the third dielectric material, where a first segment of the second spacer layer is arranged on the first spacer layer and covers the second photodetector but not the first photodetector.

15. The optical sensing device according to claim 1, wherein
a first spectral channel is formed by one first lower mirror, one second lower mirror, a section of the spacer stack covering the first photodetector and a section of the upper mirror covering the first photodetector, and
a second spectral channel is formed by one first lower mirror, one second lower mirror, a section of the spacer stack covering the second photodetector and a section of the upper mirror covering the second photodetector.

16. The optical sensing device according to claim 1, wherein the first and the second photodetector are configured to detect light incident on the optical sensing device and passing through the upper mirror, the spacer stack and the two lower mirrors.

17. A method for manufacturing an optical sensing device, wherein the method comprises
providing a photodetector array arranged on a semiconductor substrate, where the photodetector array comprises at least one first photodetector and at least one second photodetector,
depositing a first lower dielectric mirror above each photodetector in a vertical direction which is perpendicular to the main plane of extension of the substrate by employing a first mask,
depositing a second lower dielectric mirror above each photodetector in vertical direction by employing a second mask, where the first lower mirror and the second lower mirror of each photodetector are arranged next to each other in a lateral direction which is parallel to the main plane of extension of the substrate and where the first lower mirrors have a different thickness in vertical direction than the second lower mirrors,
depositing a spacer stack arranged on the first and second lower mirrors, and
depositing an upper dielectric mirror arranged on the spacer stack and covering the photodetector array.

18. The method according to claim 17, wherein the thickness in vertical direction of the spacer stack above the first photodetector is different from the thickness in vertical direction of the spacer stack above the second photodetector.

19. The method according to claim 17, wherein depositing the spacer stack comprises
depositing a first spacer layer on the first and second lower mirrors, where the first spacer layer comprises a third dielectric material,
depositing a second spacer layer on the first spacer layer, where the second spacer layer comprises the third dielectric material, and
structuring the second spacer layer by employing a third mask such that a first segment of the second spacer layer covers the second photodetector but not the first photodetector.

20. The optical sensing device according to claim 10, wherein signals of the two sub-photodetectors of each photodetector are added.

* * * * *